(12) United States Patent
Wang et al.

(10) Patent No.: US 9,136,258 B1
(45) Date of Patent: Sep. 15, 2015

(54) STACKED LED FOR OPTICAL SENSOR DEVICES

(71) Applicant: Maxim Integrated Products, Inc., San Jose, CA (US)

(72) Inventors: Ken Wang, Milpitas, CA (US); Kumar Nagarajan, Cupertino, CA (US); Seshasayee Gaddamraja, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/231,963

(22) Filed: Apr. 1, 2014

Related U.S. Application Data

(60) Provisional application No. 61/908,917, filed on Nov. 26, 2013.

(51) Int. Cl.
| | |
|---|---|
| *H01L 27/14* | (2006.01) |
| *H01L 31/00* | (2006.01) |
| *H01L 25/16* | (2006.01) |
| *H01L 25/00* | (2006.01) |
| *H01L 31/12* | (2006.01) |

(52) U.S. Cl.
CPC ............. *H01L 25/167* (2013.01); *H01L 25/50* (2013.01); *H01L 31/125* (2013.01)

(58) Field of Classification Search
CPC .................................................. H01L 31/125
See application file for complete search history.

(56) References Cited

U.S. PATENT DOCUMENTS

| | | | | |
|---|---|---|---|---|
| 4,470,682 | A * | 9/1984 | Suzuki et al. | 396/111 |
| 5,489,995 | A * | 2/1996 | Iso et al. | 358/483 |
| 6,685,092 | B2 * | 2/2004 | Patel et al. | 235/454 |
| 7,292,378 | B2 * | 11/2007 | Chiba et al. | 358/473 |
| 7,683,981 | B2 * | 3/2010 | Uemoto | 349/69 |
| 7,688,309 | B2 * | 3/2010 | Theytaz et al. | 345/166 |
| 8,118,454 | B2 * | 2/2012 | Rains et al. | 362/293 |
| 2001/0050765 | A1 * | 12/2001 | Antonelli et al. | 356/71 |
| 2002/0090184 | A1 * | 7/2002 | Sayag | 385/120 |
| 2005/0285021 | A1 * | 12/2005 | Chiu et al. | 250/216 |
| 2012/0306816 | A1 * | 12/2012 | Bridger | 345/175 |

\* cited by examiner

*Primary Examiner* — Ida M Soward
(74) *Attorney, Agent, or Firm* — Advent, LLP

(57) ABSTRACT

An optical sensor device, system, and method are described that include a substrate, an electronic device disposed on the substrate, a molding layer, a lens, and a light-emitting diode (LED) package disposed on the substrate and at least partially over the sensor and molding layer. The LED package can include an LED substrate, an LED, a lens disposed on the LED, and electrical interconnections for coupling the LED to the substrate. In implementations, a process for fabricating the optical sensor device includes backgrinding a sensor die to a slim profile; attaching the sensor die onto a substrate; placing a molding layer on the sensor die; forming a lens on the molding layer; and placing an assembled light-emitting diode package on the substrate and at least partially over the sensor die and molding layer, where the assembled light-emitting diode package includes a 3D substrate.

17 Claims, 6 Drawing Sheets

US 9,136,258 B1

STACKED LED FOR OPTICAL SENSOR DEVICES

CROSS-REFERENCE TO RELATED APPLICATIONS

The present application claims the benefit under 35 U.S.C. §119(e) of U.S. Provisional Application Ser. No. 61/908,917, filed Nov. 26, 2013, and titled "STACKED LED FOR OPTICAL SENSOR DEVICES." U.S. Provisional Application Ser. No. 61/908,917 is herein incorporated by reference in its entirety.

BACKGROUND

Electronic devices, such as smart phones, tablet computers, digital media players, and so forth, increasingly employ light sensors to control the manipulation of a variety of functions provided by the device. For example, light sensors are commonly used by electronic devices to detect ambient lighting conditions in order to control the brightness of the device's display screen. Light sensors often employ photodetectors such as photodiodes, phototransistors, or the like, which convert received light into an electrical signal (e.g., a current or voltage).

Light sensors are commonly used in Infrared (IR)-based sensing devices, such as gesture sensing devices. Gesture sensing devices enable the detection of physical movement (e.g., "gestures") without the user actually touching the device within which the gesture sensing device resides. The detected movements can be subsequently used as input commands for the device. In implementations, the electronic device is programmed to recognize distinct non-contact hand motions, such as left-to-right, right-to-left, up-to-down, down-to-up, in-to-out, out-to-in, and so forth. Gesture sensing devices have found popular use in handheld electronic devices, such as tablet computing devices and smart phones, as well as other portable electronic devices, such as laptop computers, video game consoles, and so forth.

SUMMARY

An optical sensor device, system, and method are described that include a substrate, an electronic device (e.g., a sensor) disposed on the substrate, a molding layer disposed on the sensor, a lens formed on the molding layer, and a light-emitting diode (LED) package disposed on the substrate and at least partially over the sensor and molding layer. The LED package can include an LED substrate, an LED, a lens disposed on the LED, and electrical interconnections for coupling the LED to the substrate. In an implementation, an electronic device includes an optical sensor device and a printed circuit board. In implementations, a process for fabricating the optical sensor device that employ the techniques of the present disclosure includes backgrinding a sensor die to a slim profile; attaching the sensor die onto a substrate; placing a molding layer on the sensor die; forming a lens on the molding layer; and placing an assembled light-emitting diode package on the substrate and at least partially over the sensor die and molding layer, where the assembled light-emitting diode package includes a 3D substrate. The wafer level optical device is not limited to a certain type of sensor, such as gesture sensors, but can also be used for medical or other wavelength dependent sensors (e.g., optical sensors, IR sensors, etc.).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Gesture, optical, biological, or proximity sensing devices often include light sensing devices to allow for detection of light and/or physical movement in proximity to the sensing devices. These light sensing devices are configured to detect electromagnetic radiation (e.g., light) that is generated from an illumination source and reflected from an object, such as a finger or a hand, in proximity to the sensor. Sometimes light sensing devices include a sensor as well as other components (e.g., a light source). As components are added to the light sensor, space, reliability, and optics quality are concerns. One specific concern is enabling miniaturization as well as minimizing the package body size and form factor needed to fit a given sensor die size and/or to be able to fit a much larger die into a given package body size.

Accordingly, an optical sensor device, system, and method are described that include a substrate, an electronic device (e.g., a sensor) disposed on the substrate, a molding layer disposed on the sensor, a lens formed on the molding layer, and a light-emitting diode (LED) package disposed on the substrate and at least partially over the sensor and molding layer. The LED package can include an LED substrate, an LED, a lens disposed on the LED, and electrical interconnections for coupling the LED to the substrate. In an implementation, an electronic device includes an optical sensor device and a printed circuit board. In implementations, a process for fabricating the optical sensor device that employ the techniques of the present disclosure includes backgrinding a sensor die to a slim profile; attaching the sensor die onto a substrate; placing a molding layer on the sensor die; forming a lens on the molding layer; and placing an assembled light-emitting diode package on the substrate and at least partially over the sensor die and molding layer, where the assembled light-emitting diode package includes a 3D substrate. The wafer level optical device is not limited to a certain type of sensor, such as gesture sensors, but can also be used for medical or other wavelength dependent sensors (e.g., optical sensors, IR sensors, etc.).

Example Implementations

Figure 1A:
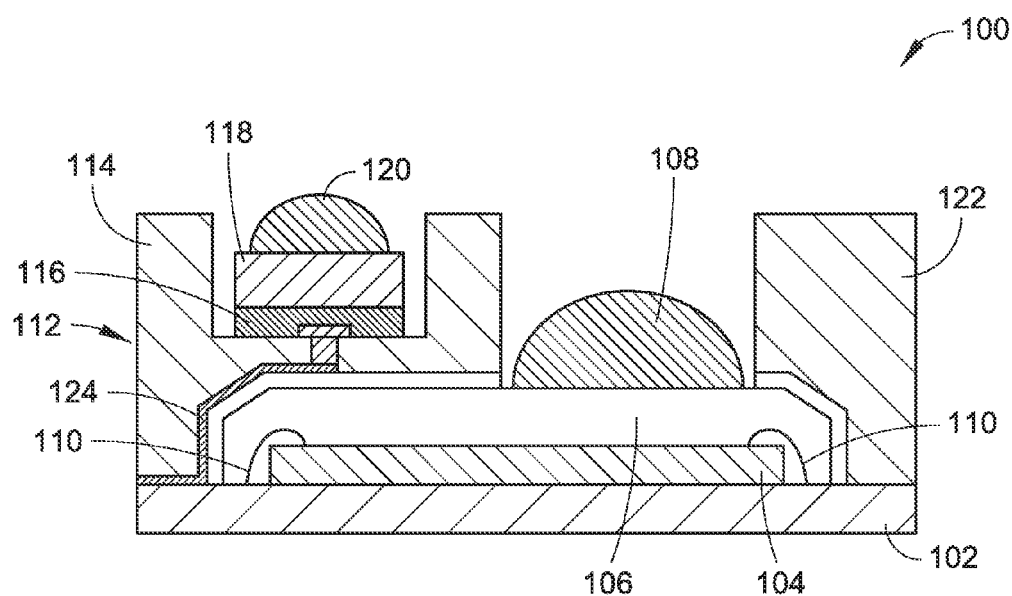
FIG. 1A is a diagrammatic cross-sectional view illustrating an embodiment of an optical sensor device that includes a light-emitting diode (LED) package disposed on a substrate and disposed at least partially over a sensor and molding layer, in accordance with an example implementation of the present disclosure.

FIGS. 1A through 1E illustrate an optical sensor device 100 in accordance with an example implementation of the present disclosure. As shown in FIG. 1A, the optical sensor device 100 includes a substrate 102. In some implementations, the substrate 102 can include a printed circuit board with routing. A printed circuit board can include a board that mechanically supports and electrically connects electronic components using conductive tracks, pads and other features etched from copper sheets laminated onto a non-conductive substrate. In a specific embodiment, the substrate 102 can include a printed circuit board that has routing configured to provide electrical connections for at least one device. In other implementations, the substrate 102 can include a ceramic material (e.g., ceramic, a glass converted to ceramic, ceramic with metal for mechanical support and/or electrical interconnections, etc.). In yet other implementations, a substrate 102 may include a wafer, such as a semiconductor wafer and/or a carrier wafer, and/or an integrated circuit chip. In one specific implementation, the substrate 102 includes a silicon wafer with integrated circuits formed therein. Additionally, the substrate 102 may include electrical interconnections formed therein (e.g., integrated circuits, redistribution layers, vias, contact pads, etc.).

As illustrated in FIG. 1A, the optical sensor device 100 includes a sensor 104 disposed on the substrate 102. In implementations, the sensor 104 can include a semiconductor device, such as an integrated circuit chip. In an embodiment, the sensor 104 can include optically active elements formed on at least one side of a semiconductor device or integrated circuit die. In these embodiments, an example sensor 104 can include a photo sensor device (e.g., photodetector) configured to detect electromagnetic radiation occurring within a limited spectrum of wavelengths (e.g., infrared light, visible light, etc.). The sensor(s) 104 can be configured for different applications, such as a gesture sensor, a biological sensor, and/or other optical sensors, for example. Additionally, the sensor 104 can include a device where a portion of a side of the sensor 104 includes an optically active portion and another portion of the sensor 104 includes a non-optically active portion.

The sensor 104 can be secured and/or attached to the substrate 102 in a variety of ways. In one embodiment, the sensor 104 can be secured and electrically connected to the substrate 102 using wirebonding, which includes using wires (e.g., wirebonds 110) to connect the sensor 104 to the substrate 102. In another embodiment, the sensor 104 can be connected to the substrate using an array of contact pads and solder balls. It is contemplated that other methods may be used to secure the sensor 104 to the substrate 102, such as using an adhesive.

As shown in FIG. 1A, the optical sensor device 100 includes a molding layer 106, which may substantially cover the sensor 104, wirebonds 110, and a portion of the substrate 102. In implementations, the molding layer 106 encapsulates the sensor 104 and may include plastic molding compounds, for example, which may include composite materials such as epoxy resins, phenolic hardeners, silicas, catalysts, pigments, and mold release agents. Molding compounds used for surface mount devices, such as the sensor 104, may be selected to have a low moisture absorption rate, a high flexural strength at board-mounting temperatures, or a combination of both in order to prevent integrity problems. In one embodiment, a molding layer 106 substantially covers a sensor 104 and corresponding wirebonds 110 and is transparent such that light and/or other electromagnetic radiation can be detected by the sensor 104.

Additionally, the optical sensor device 100 includes at least one sensor lens 108. In some implementations and as shown in FIG. 1A, the sensor lens 108 can be placed and/or formed on the molding layer 106. The sensor lens 108 can be placed so that alignment of the sensor lens 108 with the optically active portion of the sensor 104 is achieved. A sensor lens 108 may include a device that can transmit and/or refract light, such as a ball lens, a Fresnel lens, and/or other diffractive optics element lenses. Further, the sensor lens 108 may be disposed on the molding layer 106 or formed as a portion of the molding layer 106 (e.g., embedded in and/or formed from the materials of the molding layer 106).

As illustrated in FIG. 1A, the optical sensor device 100 includes an LED package 112. In implementations, an LED package 112 includes a 3D substrate 114 (e.g., a lid cover), an LED substrate 116, an LED 118, an LED lens 120, and/or at least one electrical interconnect 124. In implementations, the LED package 112 can be disposed on a portion of the substrate 102, where at least a portion of the LED package 112 is disposed over the molding layer 106 and sensor 104, as shown in FIG. 1A.

In implementations, the LED package 112 includes a 3D substrate 114. In one specific embodiment, the 3D substrate 114 can include an injection material, such as a polymer, a silicon based material, and/or a glass or ceramic. The 3D substrate 114 can function to house and/or protect an LED 118 as well as functioning as a light barrier. In an implementation, the 3D substrate 114 can include a seating plane, which further includes a surface on which the LED substrate 116 and the LED 118 can be positioned. At least one side of the 3D substrate 114 may be open so that light and/or other electromagnetic radiation from an LED 118 may be transmitted from the LED 118. In embodiments, the 3D substrate 114 can include at least one electrical interconnection 124 for electrically coupling the LED 118 to the optical sensor device 100. Some examples of an electrical interconnection 124 can include wires, metal lines, redistribution structures, vias, contact pads, etc. In some specific embodiments and as shown in FIG. 1D, the electrical interconnection 124 can include a through-hole via through the LED substrate 116 and/or a contact pad disposed between the LED substrate 116 and LED 118.

As shown in FIG. 1A, the LED package 112 includes an LED substrate 116. The LED substrate 116 can include a substrate configured for structurally and electrically supporting the LED 118. In one embodiment, an LED substrate 116 can include a silicon wafer. In another embodiment, the LED substrate 116 can include a printed circuit board. Additionally, the LED substrate 116 can include integrated circuits formed therein.

The LED package 112 includes an LED 118. As illustrated in FIG. 1A, the LED 118 can be disposed on the LED substrate 116. The LED 118 may be secured to the LED substrate 116 using different methods, such as using wirebonding, adhesives, or solder bumps, on at least a portion of the LED substrate 116 that can include circuitry configured to electrically connect the LED 118 to the LED substrate 116 and/or optical sensor device 100. In one embodiment, an LED 118 is placed on the LED substrate 116 using an adhesive and contact pads disposed on a side of the LED 118. Placing the LED 118 as a portion of the LED package 112 disposed over the molding layer 106 can function to decrease the size and footprint of the optical sensor device 100.

The LED 118 can include different types of LEDs. In implementations, the LED 118 can include a light-emitting diode, a vertical-cavity surface-emitting laser (VCSEL), and/or other laser diodes. In one embodiment, the LED 118 includes a vertical-cavity surface-emitting laser, which includes a semiconductor laser diode with laser beam emission perpendicular from the top surface of the VCSEL. Other examples of an LED 118 can include additional light sources in the visible light and/or the non-visible light range. Additionally, the LED package 112 can include at least one LED lens 120. In some implementations and as shown in FIG. 1A, the LED lens 120 can be placed on the LED 118. A LED lens 120 may include a device that can transmit and/or refract light, such as a ball lens, a Fresnel lens, and/or other diffractive optics element lenses.

Figure 1B:
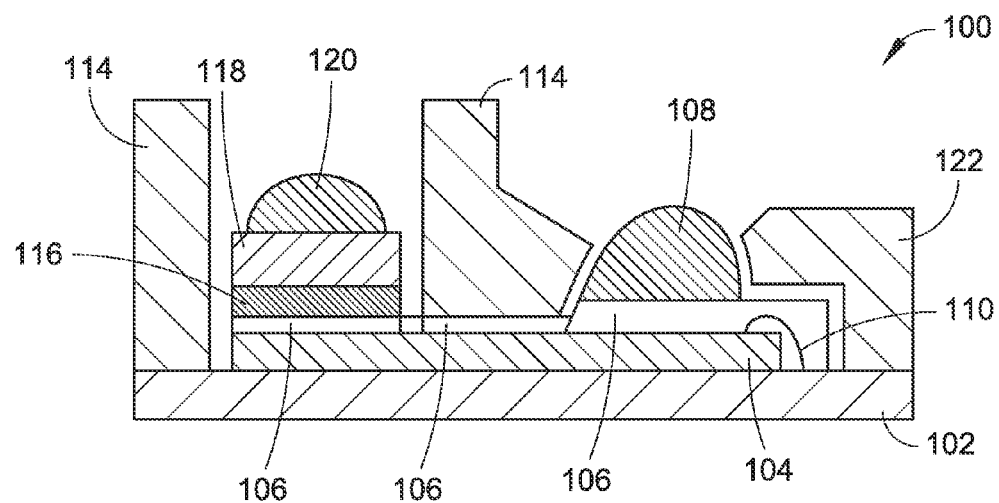
FIG. 1B is a diagrammatic cross-sectional view illustrating an embodiment of an optical sensor device that includes a light-emitting diode (LED) package disposed on a substrate and disposed at least partially over a sensor and molding layer, in accordance with an example implementation of the present disclosure.
Figure 1C:
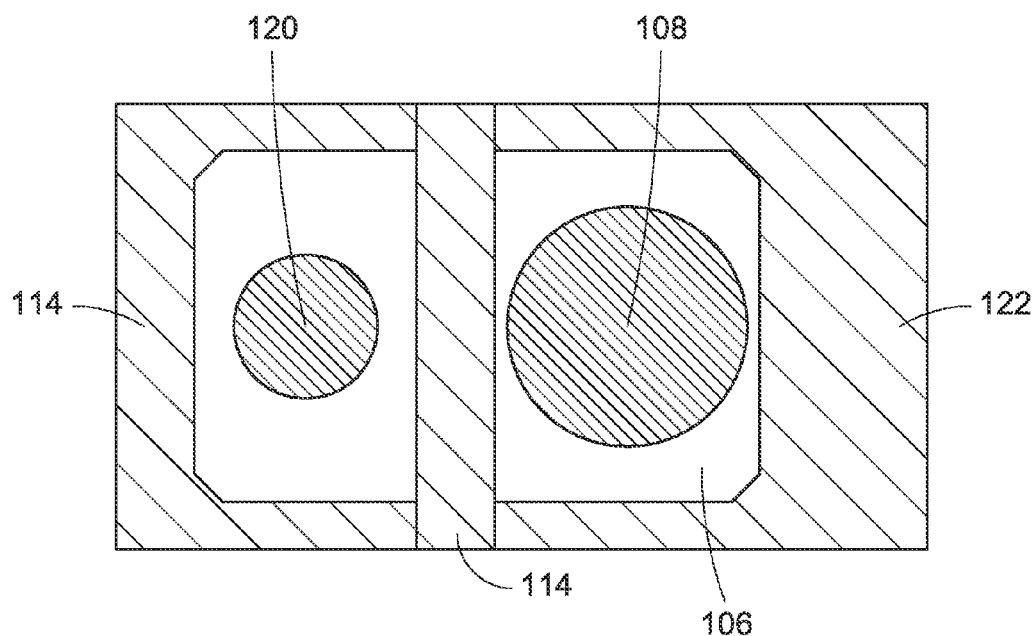
FIG. 1C is a diagrammatic top plan view illustrating an embodiment of an optical sensor device that includes a light-emitting diode (LED) package disposed on a substrate and disposed at least partially over a sensor and molding layer, in accordance with an example implementation of the present disclosure.
Figure 1D:
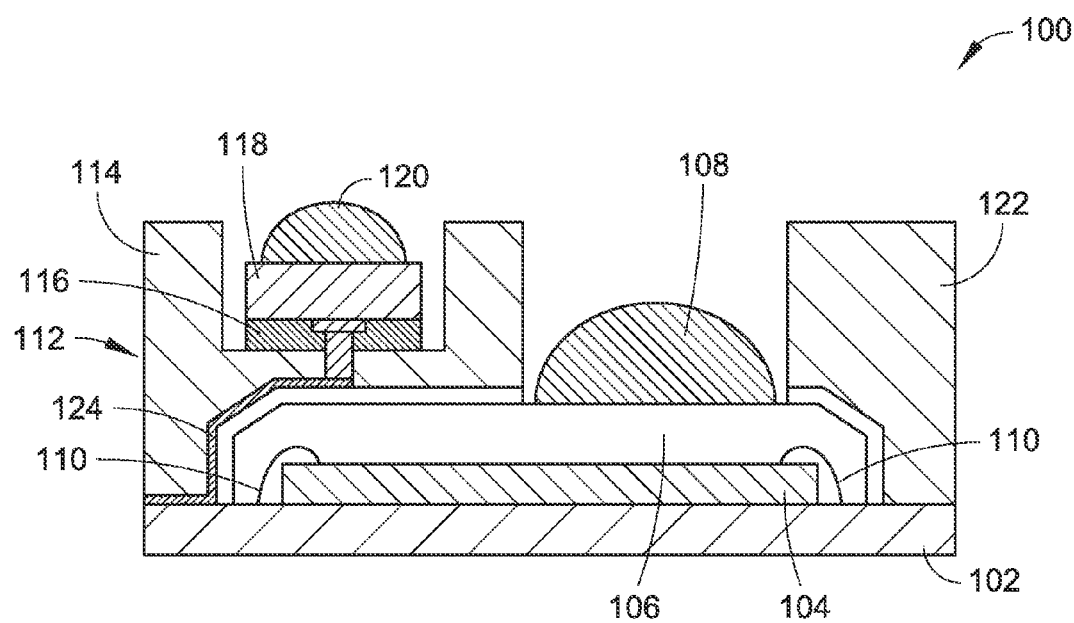
FIG. 1D is a diagrammatic side elevation view illustrating an embodiment of an optical sensor device that includes a light-emitting diode (LED) package disposed on a substrate and disposed at least partially over a sensor and molding layer, in accordance with an example implementation of the present disclosure.
Figure 1E:
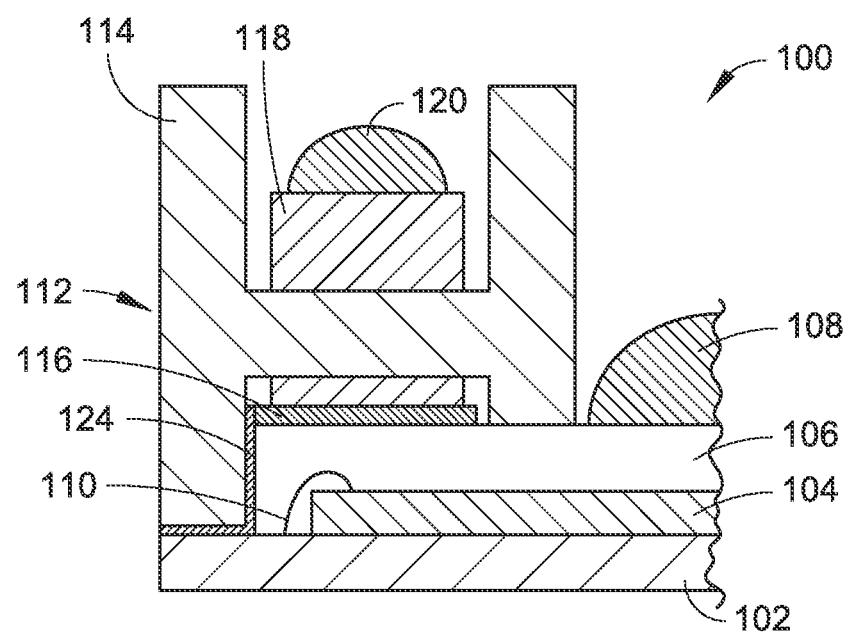
FIG. 1E is a partial diagrammatic side elevation view illustrating an embodiment of an optical sensor device that includes a light-emitting diode (LED) package disposed on a substrate and disposed at least partially over a sensor and molding layer, in accordance with an example implementation of the present disclosure.

In one embodiment illustrated in FIGS. 1B and 1C, optical sensor device 100 includes a substrate 102, a sensor 104 disposed on the substrate 102, and a molding layer 106 with a sensor lens 108 disposed on the sensor 104. In this embodiment, an LED 118 and LED substrate 116 are disposed directly on the molding layer 106 and sensor 104. At least one 3D substrate 114 is disposed on the substrate 102 and/or the molding layer 103. In this embodiment, the LED 118, LED sensor 120, and LED substrate 116 are disposed directly on the molding layer 106 and sensor 104, which can provide a lower standoff height. In the embodiment illustrated in FIGS. 1B through 1E, the 3D substrate 114 can form a ring-like substrate which can surround the LED 118 and/or LED substrate 116.

Example Processes

Figure 2:
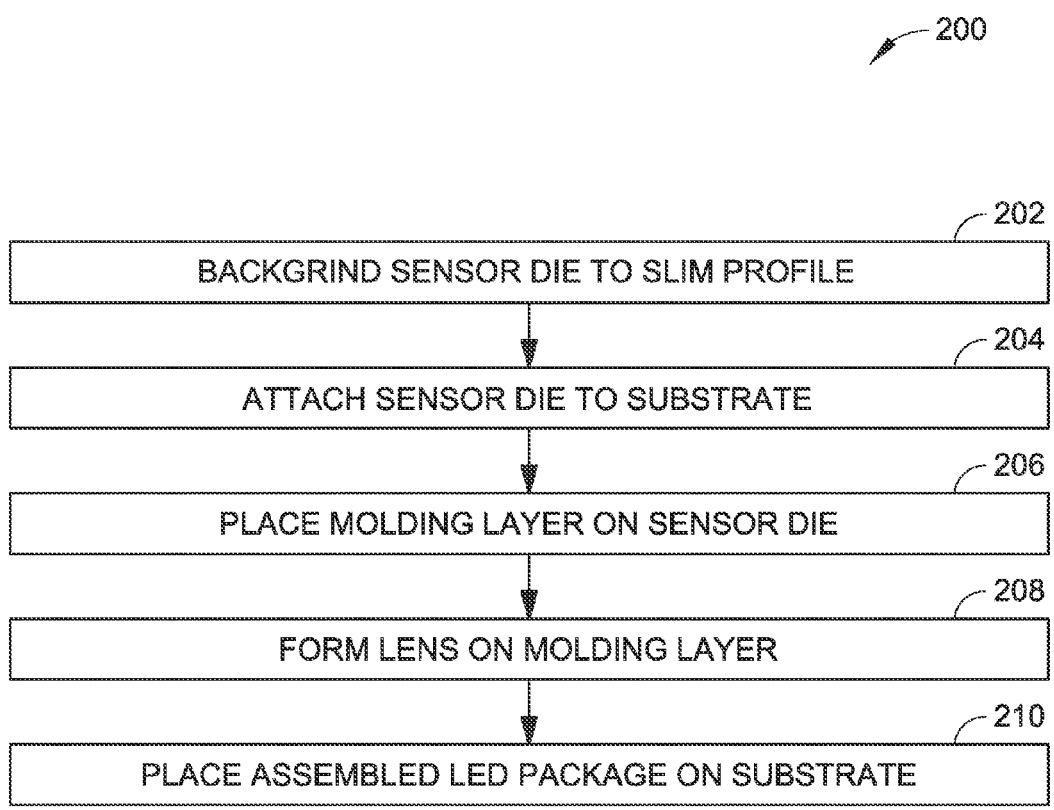
FIG. 2 is a flow diagram illustrating an example process for fabricating an optical sensor device, such as the optical sensor device illustrated in FIG. 1.

FIG. 2 illustrates an example process 200 that employs an optical sensor device, such as the optical sensor device 100 shown in FIG. 1A.

In the process 200 illustrated, a sensor die is ground to a slim profile (Block 202). In implementations, the sensor 304 (e.g., sensor die) is thinned using a backgrind or lapping process to obtain a slim die profile (e.g., 50-200 μm). The backgrind process may include wafer thinning at wafer level before singulation of the wafer into individual die. The backgrinding process can include a process where the wafer and/or die is thinned using a grinding wheel using a precise set of parameters to ensure accurate thinning. In a specific embodiment, a wafer configured to be singulated into individual sensor die is background to a thickness of approximately 50 μm. Subsequent to backgrinding, the wafer can be subjected to additional fabrication processes.

Figure 3A:
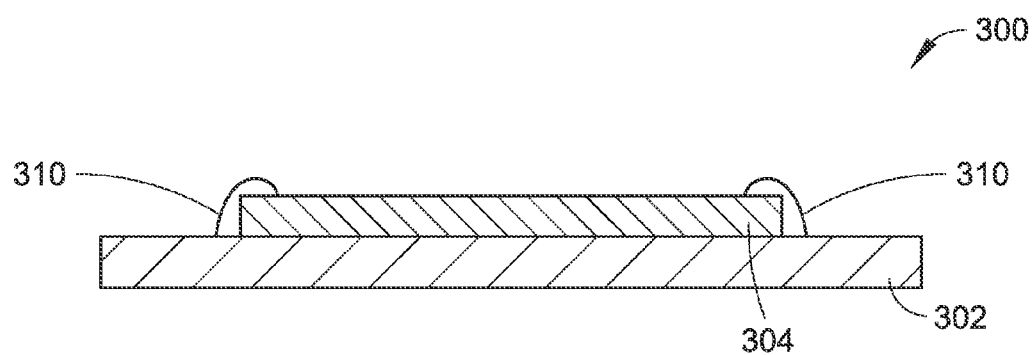
FIG. 3A is a diagrammatic partial cross-sectional side elevation view illustrating the fabrication of an optical sensor device, such as the device shown in FIG. 1, in accordance with the process shown in FIG. 2.
Figure 3B:
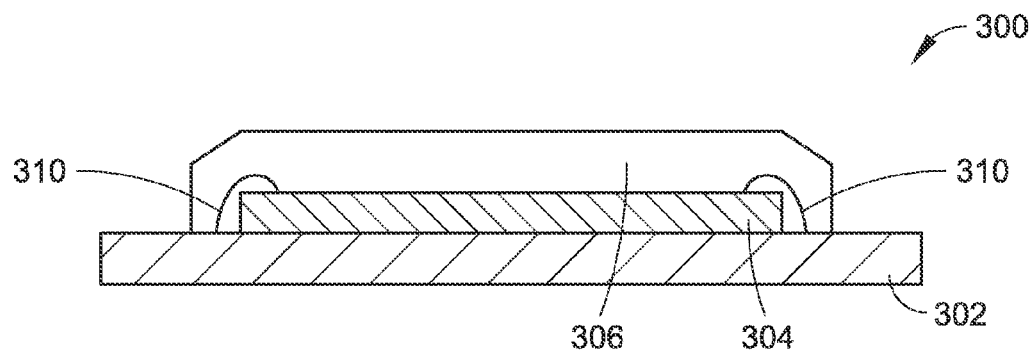
FIG. 3B is a diagrammatic partial cross-sectional side elevation view illustrating the fabrication of an optical sensor device, such as the device shown in FIG. 1, in accordance with the process shown in FIG. 2.
Figure 3C:
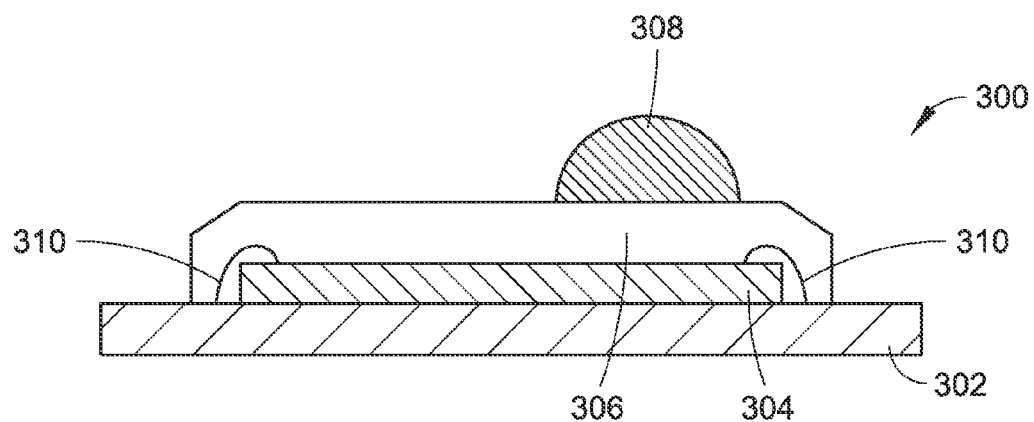
FIG. 3C is a diagrammatic partial cross-sectional side elevation view illustrating the fabrication of an optical sensor device, such as the device shown in FIG. 1, in accordance with the process shown in FIG. 2.
Figure 3D:
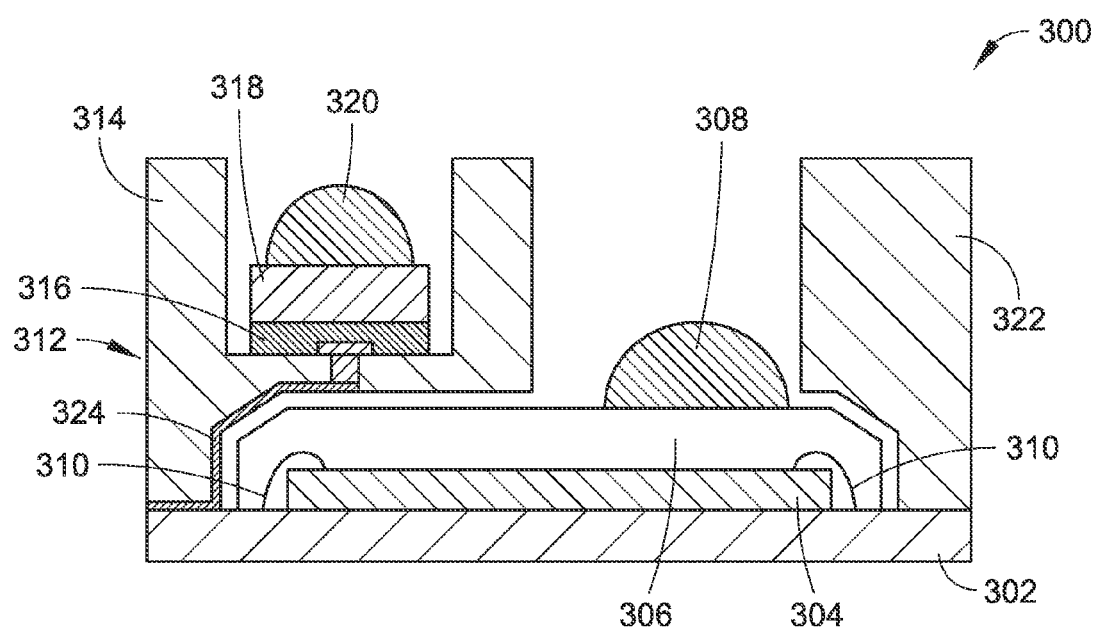
FIG. 3D is a diagrammatic partial cross-sectional side elevation view illustrating the fabrication of an optical sensor device, such as the device shown in FIG. 1, in accordance with the process shown in FIG. 2.

Then, a sensor is placed on a substrate (Block 204). In implementations, placing the sensor 304 on a substrate 302 can include placing the sensor 304 using pick-and-place technology onto a semiconductor wafer with integrated circuits formed therein. Pick-and-place technology may include using automated machines to place surface-mount devices (e.g., the sensor 304) onto a substrate 302 (e.g., a semiconductor wafer, a printed circuit board, etc.). In one embodiment and as shown in FIG. 3A, the sensor 304 can be attached to the substrate 302 using wirebonding techniques (e.g., using wirebonds 310). In other embodiments, the sensor 104 can be attached to the substrate 302 using solder bumps and/or flip-chip technology.

A molding layer is placed on the sensor die (Block 206). In implementations, placing a molding layer 306 can include placing a layer of optically-clear mold compound to cover the sensor 304. In a specific embodiment, an optically-clear mold compound can include a polymer and/or epoxy-based compound. Placing the molding layer 306 can include covering the wirebonds 310 and/or other electrical interconnections.

A lens is formed on the molding layer (Block 208). In an embodiment, forming a lens 308 can include forming a lens 308 from a portion of the molding layer 306. In other embodiments, forming a lens 308 can include placing a lens 308 on the molding layer 306, where the lens is pre-formed. Forming the lens 308 on the molding layer 306 can include forming and/or placing a lens that can transmit and/or refract light, such as a ball lens, a Fresnel lens, and/or other diffractive optics element lenses.

Then, an assembled LED package is placed on the substrate (Block 208). In implementations, placing an assembled LED package 312 can include placing the LED package 312 on the substrate 302. Additionally, placing the LED package 312 can include placing at least one additional 3D substrate 322 on the substrate 302 where the 3D substrate 322 is configured to function as structural support and/or as a light blocker. Placing the LED package 312 can include placing the LED package 312 at least partially over the molding layer 306 and/or the sensor 304 at least in order to reduce the footprint of the LED 318 and/or LED package 312. In implementations, placing the LED package 312 can include placing an LED package 312, including an LED 314 on a LED substrate 316, an LED lens 320, and at least one electrical interconnect 324, over but not touching a portion of the molding layer 306. In some embodiments, placing an assembled LED package 312 on the substrate 302 can include placing an LED 318, LED lens 120, and LED substrate 316 directly on the molding layer 306 and separately placing at least one 3D substrate 322 on the substrate 302 and/or molding layer 306. In this specific embodiment, the LED substrate 316 directly contacts the molding layer 306 instead of being disposed on a portion of the 3D substrate 322.

Following fabrication of the optical sensor device 100 and system, the optical sensor device 100 may be further singulated and combined with a printed circuit board to form an electronic device, which may be used in other systems, such as mobile phones and/or computing systems. Additionally, the printed circuit board may be further singulated to generate an individual package and/or module.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer level optical device, comprising:
   a substrate;
   a sensor disposed on the substrate;
   a molding layer disposed over the sensor;
   a lens formed on the molding layer; and
   a light-emitting diode package disposed on the substrate, where the light-emitting diode package at least partially covers the sensor and the molding layer, the light-emitting diode package including
     at least one 3D substrate,
     a light-emitting diode substrate,
     a light-emitting diode disposed on the light-emitting diode substrate, and
     a light-emitting diode lens disposed on the light-emitting diode.

2. The wafer level optical device in claim 1, wherein the sensor is approximately 50-200 μm in thickness.

3. The wafer level optical device in claim 1, wherein the sensor includes a photodetector.

4. The wafer level optical device in claim 1, wherein the sensor is disposed on the substrate using wirebonds.

5. The wafer level optical device in claim 1, wherein the molding layer is substantially transparent.

6. The wafer level optical device in claim 1, wherein the lens includes an optically clear molding compound.

7. The wafer level optical device in claim 1, wherein the light-emitting diode substrate is disposed on a seating plane within the 3D substrate.

8. The wafer level optical device in claim 1, wherein the light-emitting diode substrate is disposed on the molding layer.

9. The wafer level optical device in claim 1, wherein the 3D substrate includes a polymer injection material.

10. An electronic device, comprising:
    a printed circuit board; and
    a wafer level optical device disposed on the printed circuit board, the wafer level optical device including
      a substrate;
      a sensor disposed on the substrate;
      a molding layer disposed over the sensor;
      a lens formed on the molding layer; and
      a light-emitting diode package disposed on the substrate, where the light-emitting diode package at least partially covers the sensor and the molding layer, the light-emitting diode package including
        at least one 3D substrate,
        a light-emitting diode substrate disposed on a seating plane within the 3D substrate,
        a light-emitting diode disposed on the light-emitting diode substrate, and
        a light-emitting diode lens disposed on the light-emitting diode.

11. The electronic device in claim 10, wherein the sensor is approximately 50-200 μm in thickness.

12. The electronic device in claim 10, wherein the sensor includes a photodetector.

13. The electronic device in claim 10, wherein the sensor is disposed on the substrate using wirebonds.

14. The electronic device in claim 10, wherein the lens includes an optically clear molding compound.

15. The electronic device in claim 10, wherein the light-emitting diode substrate is disposed on a seating plane within the 3D substrate.

16. The electronic device in claim 10, wherein the light-emitting diode substrate is disposed on the molding layer.

17. The electronic device in claim 10, wherein the 3D substrate includes a polymer injection material.

* * * * *